United States Patent
Oh et al.

(10) Patent No.: US 8,551,805 B2
(45) Date of Patent: Oct. 8, 2013

(54) METHODS OF MANUFACTURING PHASE-CHANGE MEMORY DEVICES

(75) Inventors: Gyu-Hwan Oh, Hwaseong-si (KR); Doo-Hwan Park, Yongin-si (KR); Kyung-Min Chung, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/469,498

(22) Filed: May 11, 2012

(65) Prior Publication Data
US 2012/0322223 A1 Dec. 20, 2012

(30) Foreign Application Priority Data

May 17, 2011 (KR) ........................ 10-2011-0046420

(51) Int. Cl.
| | |
|---|---|
| H01L 21/00 | (2006.01) |
| H01L 21/44 | (2006.01) |
| H01L 21/4763 | (2006.01) |
| H01L 21/302 | (2006.01) |
| H01L 21/461 | (2006.01) |
| H01L 41/00 | (2013.01) |

(52) U.S. Cl.
USPC ............. 438/95; 438/102; 438/798; 438/618; 438/710; 257/E45.002; 257/4; 257/E21.17

(58) Field of Classification Search
USPC .................... 438/95, 257, 513, 514, 798, 102, 438/385, 618, 710; 257/4, 529, 537, E21.17, 257/E21.27, E21.645, E29.17, E29.169, E45.002, 257/E47.001
See application file for complete search history.

(56) References Cited

U.S. PATENT DOCUMENTS

| | | | | |
|---|---|---|---|---|
| 6,017,790 | A | * | 1/2000 | Liou et al. ..................... 438/240 |
| 6,096,645 | A | * | 8/2000 | Lo et al. ......................... 438/680 |
| 6,309,959 | B1 | * | 10/2001 | Wang et al. .................... 438/625 |
| 7,785,923 | B2 | * | 8/2010 | Chang et al. ................... 438/102 |
| 2004/0121526 | A1 | * | 6/2004 | Yamamoto .................... 438/142 |

(Continued)

FOREIGN PATENT DOCUMENTS

| | | |
|---|---|---|
| KR | 1020050031160 A | 4/2005 |
| KR | 1020060012848 A | 2/2006 |
| KR | 100655440 B1 | 12/2006 |
| KR | 100728984 B1 | 6/2007 |

OTHER PUBLICATIONS

Jeong, Chang-Wook, "Phase-Changeable Memory Device for Reducing Current Consumption and Forming Stable Structure and Forming Method Thereof" KR Pub# 1020050031160 A, Apr. 6, 2005. (KIPO Machine Translation).*

*Primary Examiner* — Mary Wilczewski
*Assistant Examiner* — Erik T Peterson
(74) *Attorney, Agent, or Firm* — Myers Bigel Sibley & Sajovec, P.A.

(57) ABSTRACT

A phase-change memory device includes a word line on a substrate and a phase-change memory cell on the word line and comprising a phase-change material pattern. The device also includes a non-uniform conductivity layer pattern comprising a conductive region on the phase-change material pattern and a non-conductive region contiguous therewith. The device further includes a bit line on the conductive region of the non-uniform conductivity layer pattern. In some embodiments, the phase-change memory cell may further include a diode on the word line, a heating electrode on the diode and wherein the phase-change material layer is disposed on the heating electrode. An ohmic contact layer and a contact plug may be disposed between the diode and the heating electrode.

5 Claims, 14 Drawing Sheets

(56) References Cited

U.S. PATENT DOCUMENTS

| | | |
|---|---|---|
| 2005/0158990 A1* | 7/2005 | Park et al. .................... 438/648 |
| 2006/0030108 A1 | 2/2006 | Cho et al. |
| 2007/0037335 A1* | 2/2007 | Chambers et al. ............ 438/197 |
| 2007/0076486 A1 | 4/2007 | Jeong et al. |
| 2008/0011999 A1* | 1/2008 | Choi et al. ...................... 257/4 |
| 2008/0182411 A1* | 7/2008 | Elers ............................ 438/685 |
| 2010/0022086 A1* | 1/2010 | Choi et al. .................... 438/653 |
| 2010/0190321 A1* | 7/2010 | Oh et al. ...................... 438/478 |
| 2010/0227449 A1* | 9/2010 | Kim et al. .................... 438/382 |
| 2011/0147692 A1* | 6/2011 | Park et al. ....................... 257/2 |

* cited by examiner

METHODS OF MANUFACTURING PHASE-CHANGE MEMORY DEVICES

CROSS-REFERENCE TO RELATED APPLICATION

This application claims priority under 35 USC §119 to Korean Patent Application No. 10-2011-0046420, filed on May 17, 2011 in the Korean Intellectual Property Office (KIPO), the contents of which are herein incorporated by reference in their entirety.

BACKGROUND

Example embodiments relate to phase-change memory devices and methods of manufacturing the same.

As a design rule of a phase-change memory device is reduced, misalignments between a phase-change material layer and an upper electrode or between the upper electrode and a bit line may occur, so that the phase-change material layer may be exposed and vaporized during fabrication. In a phase-change memory device with a conventional cell structure including an upper electrode between the phase-change material layer and the bit line, as the phase-change memory device becomes more highly integrated, misalignment between the upper electrode and the phase-change material layer may occur more frequently.

As the cell size of the phase-change memory device decreases, it may be desirable to use a phase-change memory device cell structure without an upper electrode. However, when an etch stop layer is formed on the phase-change material layer without an upper electrode during an etching process for forming a bit line, the etch stop layer may not be removed completely.

SUMMARY

In some embodiments, a phase-change memory device includes a word line on a substrate and a phase-change memory cell on the word line and comprising a phase-change material pattern. The device also includes a non-uniform conductivity layer pattern comprising a conductive region on the phase-change material pattern and a non-conductive region contiguous therewith. The device further includes a bit line on the conductive region of the non-uniform conductivity layer pattern. In some embodiments, the phase-change memory cell may further include a diode on the word line, a heating electrode on the diode and wherein the phase-change material layer is disposed on the heating electrode. An ohmic contact layer and a contact plug may be disposed between the diode and the heating electrode.

The non-conductive region of the non-uniform conductivity layer pattern may include a metal oxide and the conductive region of the non-uniform conductivity layer pattern may include a conductive metal compound including the metal of the metal oxide of the non-conductive region. The conductive metal compound may include a metal nitride and/or a metal carbide. The non-conductive region of the non-uniform conductivity layer pattern may include magnesium oxide, aluminum oxide, titanium oxide, tantalum oxide, nickel oxide, cobalt oxide, tungsten oxide and/or hafnium oxide.

In some embodiments, the bit line may substantially cover the conductive region of the non-uniform conductivity layer pattern. The conductive region of the non-uniform conductivity layer pattern may substantially cover the phase-change material pattern. The non-uniform conductivity layer pattern may have a thickness of about 50 Å to about 150 Å.

Further embodiments provide methods comprising forming a first mold layer on a substrate and having a first opening exposing a word line. A contact plug is formed on the word line in the first opening. A second mold layer is formed on the first mold layer and has a second opening exposing the contact plug. A heating electrode is formed on the contact plug in the second opening. A third mold layer is formed on the second mold layer and has a third opening exposing the heating electrode. A phase-change material pattern is formed on the heating electrode in the third opening. A material layer is formed on the phase-change material pattern and the third mold layer. The material layer is treated to form an increased conductivity region on the phase-change material layer. A bit line is formed on the increased conductivity region of the material layer.

Treating the material layer to form an increased conductivity region on the phase-change material layer may include forming a fourth mold layer on the material layer and having a fourth opening exposing a portion of the material layer on the phase-change material pattern. The exposed portion of the material layer may be plasma treated to form the increased conductivity region. Plasma treating the exposed portion of the material layer to form the increased conductivity region may include plasma hydrogenating to reduce the exposed portion of the material layer to a metal and plasma nitriding the metal to produce a metal nitride region. Plasma nitriding may include plasma nitriding using nitrogen ($N_2$) gas, ammonia ($NH_3$) gas and/or hydrazine ($N_2H_4$) gas.

In further embodiments, treating the material layer to form an increased conductivity region on the phase-change material layer may include plasma hydrogenating to reduce the exposed portion of the material layer to a metal and plasma carbonizing the metal to form a metal carbide region. Plasma carbonizing may include using coal, graphite, carbon fiber, carbon nanotubes and/or carbon black.

In some embodiments, the material layer may include magnesium oxide, aluminum oxide, titanium oxide, tantalum oxide, nickel oxide, cobalt oxide, tungsten oxide and/or hafnium oxide. Forming a contact plug on the word line in the first opening may be preceded by sequentially forming a diode and an ohmic contact layer on the word line in the first opening and forming a contact plug on the word line in the first opening may include forming the contact plug on the ohmic contact layer.

Further embodiments provide methods including forming a phase-change memory cell on a substrate. The phase-change memory cell includes a phase-change material pattern. A material layer is formed on the phase-change material pattern and treated to form an increased conductivity region on the phase-change material layer. A bit line is formed on the increased conductivity region of the material layer. Treating the material layer to form an increased conductivity region on the phase-change material layer may include forming a mold layer on the material layer and having an opening exposing a portion of the material layer on the phase-change material pattern and plasma treating the exposed portion of the material layer to form the increased conductivity region. Plasma treating the exposed portion of the material layer to form the increased conductivity region may include plasma hydrogenating to reduce the exposed portion of the material layer to a metal and plasma nitriding or plasma carbonizing the metal to produce a metal nitride region or a metal carbide region.

Example embodiments may provide a phase-change memory device free of misalignment between an upper electrode and a phase-change material layer.

Example embodiments may provide a method of manufacturing the phase-change memory.

According to example embodiments, in a phase-change memory device, a bit line and a phase-change material pattern may contact each other without an upper electrode, by a reduction treatment process and a nitridation treatment process of a transition metal oxide. Therefore, the misalignment between the upper electrode and the phase-change material pattern may be reduced or prevented.

Additionally, the transition metal oxide may serve as an etch stop layer during an etching process for forming the bit line, so that the phase-change material may not be exposed not to be vaporized, even though a misalignment between the bit line and an underlying phase-change material pattern may occur.

BRIEF DESCRIPTION OF THE DRAWINGS

Example embodiments will be more clearly understood from the following detailed description taken in conjunction with the accompanying drawings.

FIG. 1 is a perspective view illustrating a phase-change memory device in accordance with first embodiments;

FIG. 2 is a cross-sectional view illustrating the phase-change memory device taken along a line I-I' of FIG. 1;

FIGS. 3 to 10 are cross-sectional views illustrating operations for fabricating the phase-change memory device of FIGS. 1 and 2;

FIG. 11 is a perspective view illustrating a phase-change memory device in accordance with second embodiments;

FIG. 12 is a cross-sectional view illustrating the phase-change memory device taken along a line II-II' of FIG. 11;

FIGS. 13 to 16 are cross-sectional views illustrating operations for fabricating the phase-change memory device of FIGS. 11 and 12;

FIG. 17 is a perspective view illustrating a phase-change memory device in accordance with third embodiments;

FIG. 18 is a cross-sectional view illustrating the phase-change memory device taken along a line III-III' of FIG. 17; and FIGS. 19 to 20 are cross-sectional views illustrating operations for fabricating the phase-change memory device of FIGS. 17 and 18.

DETAILED DESCRIPTION OF THE EMBODIMENTS

Figure 1:
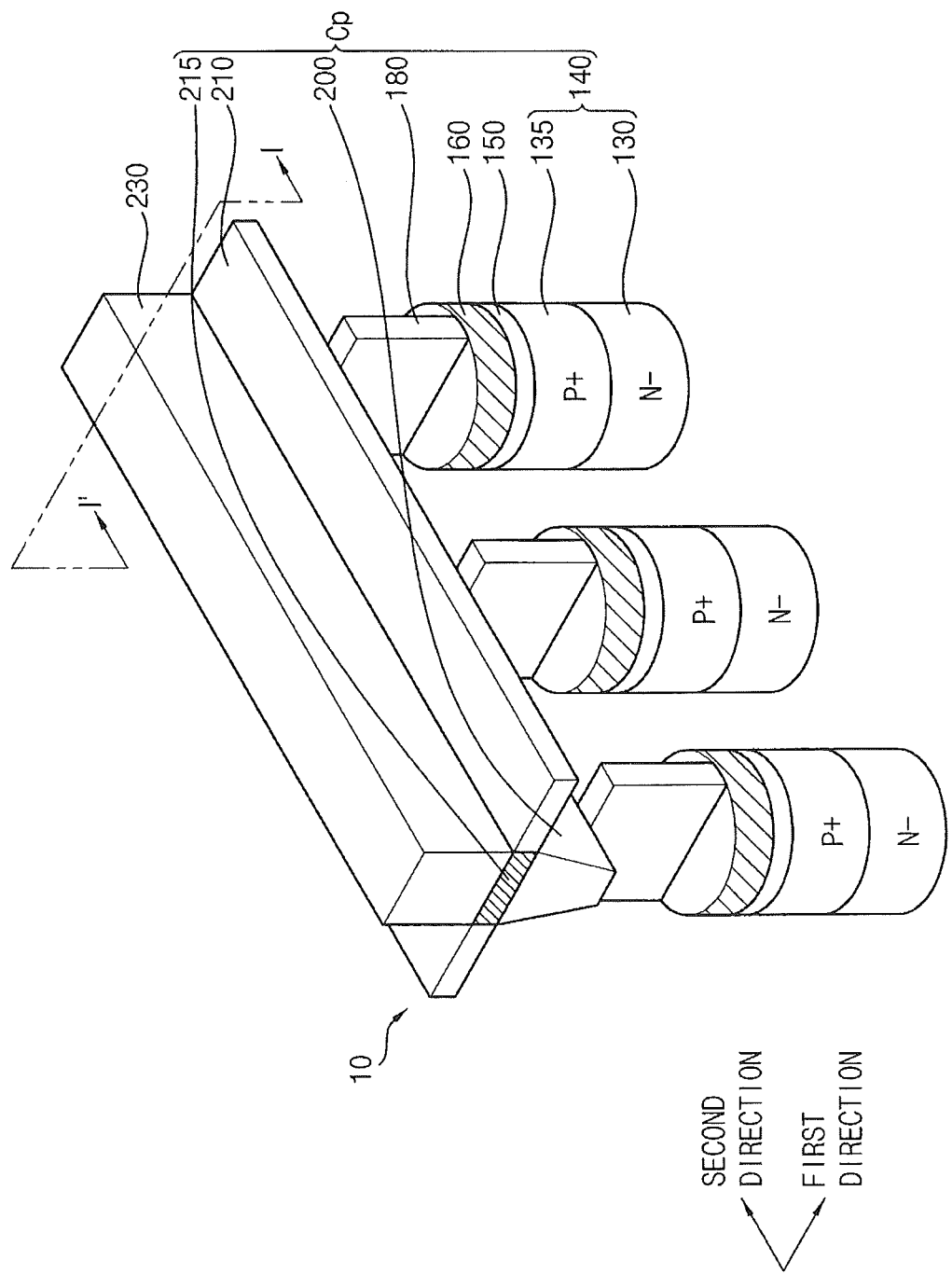
FIGS. 1 to 20 represent non-limiting, example embodiments as described herein.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

First Embodiments

Figure 2:
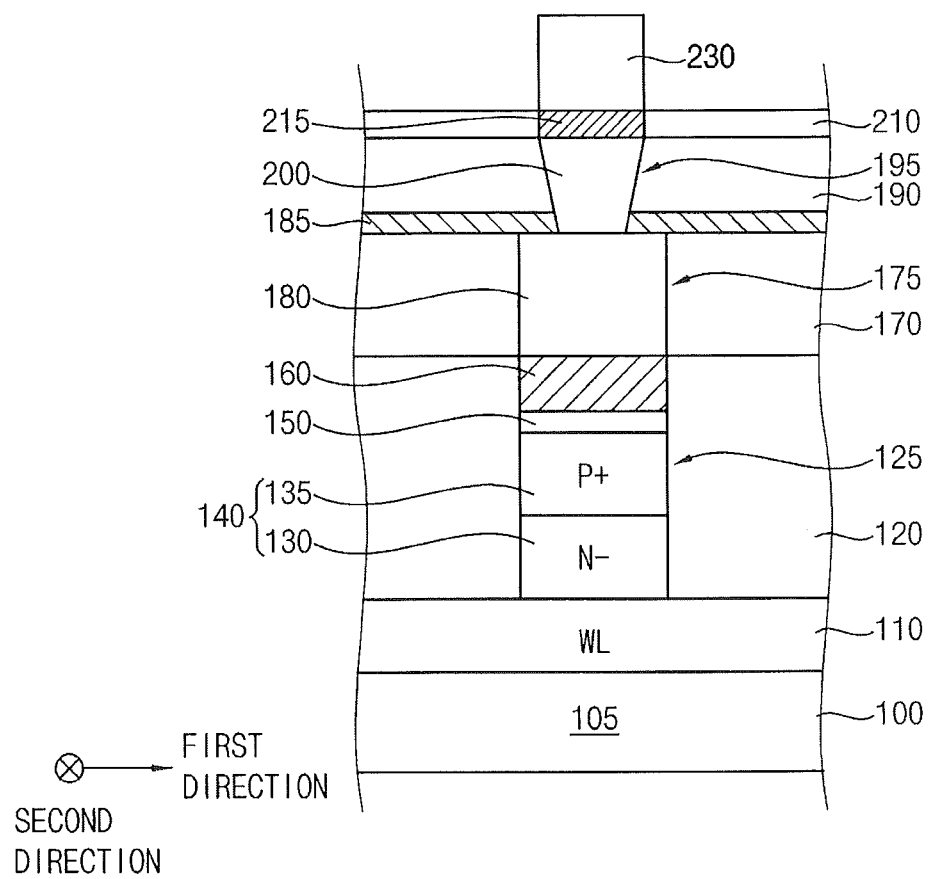

FIG. 1 is a perspective view illustrating a phase-change memory device in accordance with first embodiments. FIG. 2 is a cross-sectional view illustrating the phase-change memory device taken along a line I-I' of FIG. 1.

Referring to FIGS. 1 and 2, the phase-change memory device 10 may include a substrate 100, a phase-change memory cell (hereinafter, referred to as "a unit cell") Cp on the substrate 100, a non-uniform conductivity layer pattern on the unit cell Cp and a bit line 230 on the non-uniform conductivity layer pattern. The unit cell Cp may include a diode 140 on the substrate 100, a heating electrode 180 on the diode 140 and a phase-change material pattern 200 on the heating electrode 180. The non-uniform conductivity layer pattern may include a conductive pattern 215 on the phase-change material pattern 200 and a second etch stop layer pattern 210 on both sides of the conductive pattern 215. The conductive pattern 215 may be a conductive region, and the second etch stop layer pattern 210 may be a non-conductive region. The unit cell Cp may further include a contact plug 160 and an ohmic contact layer 150 for reducing a contact resistance between the diode 140 and the contact plug 160.

The phase-change memory device 10 may further include a first mold layer 120, a second mold layer 170 and a third mold layer 190. The first mold layer 120 may include a first opening 125 for containing the diode 140, the ohmic contact layer 150 and the contact plug 160 on the substrate 100. The second mold layer 170 may include a second opening 175 for containing the heating electrode 180 on the contact plug 160 and the first mold layer 120. The third mold layer 190 may include a third opening 195 for containing the phase-change material pattern 200 on the heating electrode 180 and the second mold layer 170.

The substrate 100 may include a silicon substrate, a silicon-on-insulator (SOI) substrate, a gallium arsenide substrate and/or a silicon germanium substrate. The substrate 100 may be divided into an active region 105 having a plurality of word lines 110 at upper portions thereof and a field region having no word lines 110. The word lines 110 in the substrate 100 may include impurities having a conductive type different from that of a portion of the substrate 100 between the field regions. For example, when the substrate 100 is a p-type silicon substrate, the word lines 110 may include n-type impurities. Alternatively, the word lines 110 may include a metal thin film. The active region 105 may extend in a first direction, so that each word line 110 may also extend in the first direction.

The first mold layer 120 may be disposed on the substrate 100 including the word lines 110. The first mold layer 120 may include silicon oxide, e.g., undoped silicate glass (USG), spin on glass (SOG), borophospho silicate glass (BPSG), tonen silazene (TOSZ), flowable oxide (FOX), plasma enhanced tetra ethyl ortho silicate (PE-TEOS) and/or high density plasma chemical vapor deposition (HDP-CVD).

The first opening 125 partially exposing the word line 110 may be disposed through the first mold layer 120. In example embodiments, a plurality of islanded first openings 125 may have a circular or elliptical shape and may be arrayed in the first direction and the second direction perpendicular to the first direction. The first opening 125 may contain the diode 140, the ohmic contact layer 150 and the contact plug 160 therein.

The diode 140 may include a first conductive layer 130 and a second conductive layer 135 sequentially stacked. The first and second conductive layers 130 and 135 may include polysilicon doped with impurities and the conductive type of the impurities of the first and second conductive layers 130 and 135 may be different from each other. For example, when the first conductive layer 130 includes n-type impurities, the second conductive layer 135 may include p-type impurities. Alternatively, when the first conductive layer 130 includes p-type impurities, the second conductive layer 135 may include n-type impurities. The first and second conductive layers 130 and 135 may be epitaxial layers having single crystalline structure as the word line 110. The diode 140 may have a shape of a circle or an ellipse according to the shape of the first opening 125. In example embodiments, a plurality of diodes 140 may be arranged in the first direction and the second direction.

The ohmic contact layer 150 may be disposed on the diode 140. The ohmic contact layer 150 may include a metal silicide, e.g., cobalt silicide and/or tungsten silicide.

The contact plug 160 filling a remaining portion of the first opening 125 may be disposed on the ohmic contact layer 150. The contact plug 160 may include tungsten. The ohmic contact layer 150 and the contact plug 160 may also have a shape of a circle or an ellipse as the diode 140. In example embodiments, a plurality of ohmic contact layers 150 and a plurality of contact plugs 160 may be arranged in the first direction and the second direction, respectively. The ohmic contact layer 150 may reduce a contact resistance between the diode 140 and the contact plug 160.

The second mold layer 170 may be disposed on the contact plug 160 and the first mold layer 120. The second mold layer 170 may include silicon oxide as the first mold layer 120, however, may not be limited thereto. For example, the second mold layer 170 may include silicon nitride or silicon oxynitride.

The second opening 175 partially exposing a top surface of the contact plug 160 may be disposed through the second mold layer 170. In example embodiments, a plurality of islanded second openings 175 may be arrayed in the first direction and the second direction. The second opening 175 may be filled with the heating electrode 180.

The heating electrode 180 may be disposed on the contact plug 160. For example, the heating electrode 180 may include titanium carbide (TiC), tantalum carbide (TaC), titanium nitride (TiN), tantalum nitride (TaN), tungsten nitride (WN), titanium carbon nitride (TiCN), titanium silicon nitride (TiSiN) and/or tantalum silicon nitride (TaSiN). The heating electrode 180 may have a shape of a rectangular pillar according to the shape of the second opening 175. In example embodiments, a plurality of heating electrodes 180 may be arranged in the first direction and the second direction.

The third mold layer 190 may be disposed on the heating electrode 180 and the second mold layer 170. The third mold layer 190 may include silicon oxide as the second mold layer 170. Alternatively, the third mold layer 190 may have a dual layer structure including a silicon oxynitride layer and a silicon oxide layer.

The third opening 195 partially exposing a top surface of the heating electrode 180 may be disposed through the third mold layer 190. The third opening 195 may have a linear shape extending in the second direction on the heating electrode 180. That is, the linear shaped third opening 195 may be disposed to expose top surfaces of the plurality of heating electrodes 180 arranged in the second direction. In example embodiments, a plurality of third openings 195 parallel to each other in the first direction may be formed. The third opening 195 may be filled with the phase-change material pattern 200.

A first etch stop layer pattern 185 having a desired etch selectivity may be further disposed between the second mold layer 170 and the third mold layer 190. The first etch stop layer pattern 185 may include silicon nitride or silicon oxynitride.

The phase-change material pattern 200 may be disposed on the heating electrode 180 and the second mold layer 170. The phase-change material pattern 200 may include a chalcogenide compound, e.g., GeTe, SbTe, GeSbTe, GeTeAs, SnTeSn, SeTeSn, GeTeSe, SbSeBi, GeBiTe, GeTeTi, InSe, GaTeSe and/or InSbTe. The phase-change material pattern 200 may have a linear shape according to the shape of the third opening 195. In example embodiments, a plurality of phase-change material patterns 200 parallel to each other in the first direction may be formed.

The second etch stop layer pattern 210 may be disposed on the third mold layer 190. In example embodiments, the second etch stop layer pattern 210 may have a thickness of about 50 Å to about 150 Å. The second etch stop layer pattern 210 may include a metal oxide, e.g., magnesium oxide, aluminum oxide, titanium oxide, tantalum oxide, nickel oxide, cobalt oxide, tungsten oxide and/or hafnium oxide. The metal oxide of the second etch stop layer pattern 210 may have a desired etch selectivity with respect to the silicon oxide of the third mold layer 190.

The conductive pattern 215 may be disposed on the phase-change material pattern 200 between the second etch stop layer patterns 210. The conductive pattern 215 may include a metal nitride or a metal carbide formed by reducing and nitriding the second etch stop layer pattern 210. That is, the conductive pattern 215 may include a conductive metal compound including the metal of the metal oxide of the second etch stop layer pattern 210, and thus the metal of the conductive pattern 215 may be determined in accordance with the second etch stop layer pattern 210.

In example embodiments, the conductive pattern 215 may include a metal nitride, e.g., magnesium nitride, aluminum nitride, titanium nitride, tantalum nitride, nickel nitride, cobalt nitride, tungsten nitride and/or hafnium nitride formed by reducing and nitriding the second etch stop layer pattern 210. Alternatively, the conductive pattern 215 may include a metal carbide, e.g., magnesium carbide, aluminum carbide, titanium carbide, tantalum carbide, nickel carbide, cobalt carbide, tungsten carbide and/or hafnium carbide formed by reducing and carbiding the second etch stop layer pattern 210.

The conductive pattern 215 may be disposed on the phase-change material pattern 200. Therefore, the conductive pattern 215 may also have a linear shape extending in the second direction. In example embodiments, a plurality of conductive patterns 215 parallel to each other in the first direction may be formed. Further, the conductive pattern 215 may sufficiently cover a top surface of the phase-change material pattern 200. Accordingly, the conductive pattern 215 may serve as a current path between the phase-change material pattern 200 and the bit line 230.

The conductive pattern 215 may be formed from the second etch stop layer pattern 210, so that the conductive pattern 215 may have a thickness substantially the same as or below about 140% of a thickness of the second etch stop layer pattern 210. For example, the conductive pattern 215 may have a thickness of about 50 Å to about 200 Å.

The bit line 230 may be disposed on the conductive pattern 215. The bit line 230 may extend in the second direction. The bit line 230 may include copper or tungsten. When the bit line 230 includes copper, a barrier layer covering the bit line 230 may be further formed. The barrier layer may include titanium, titanium nitride, tantalum nitride and/or titanium silicide.

The bit line 230 may sufficiently cover a top surface of the conductive pattern 215. A width of a bottom surface of the bit line 230 may be substantially the same as that of a top surface of the conductive pattern 215. Therefore, an electrical contact between the conductive pattern 215 and the bit line 230 may be maximized.

As described above, in the phase-change memory device 100, the phase-change material pattern 200 may be covered by, and thus may not be exposed by the conductive pattern 215 and the second etch stop layer pattern 210, so that electrical contact characteristics between the bit line 230 and the phase-change material pattern 200 may be improved.

FIGS. 3 to 10 are cross-sectional views illustrating operations for fabricating the phase-change memory device of FIGS. 1 and 2.

Figure 3:
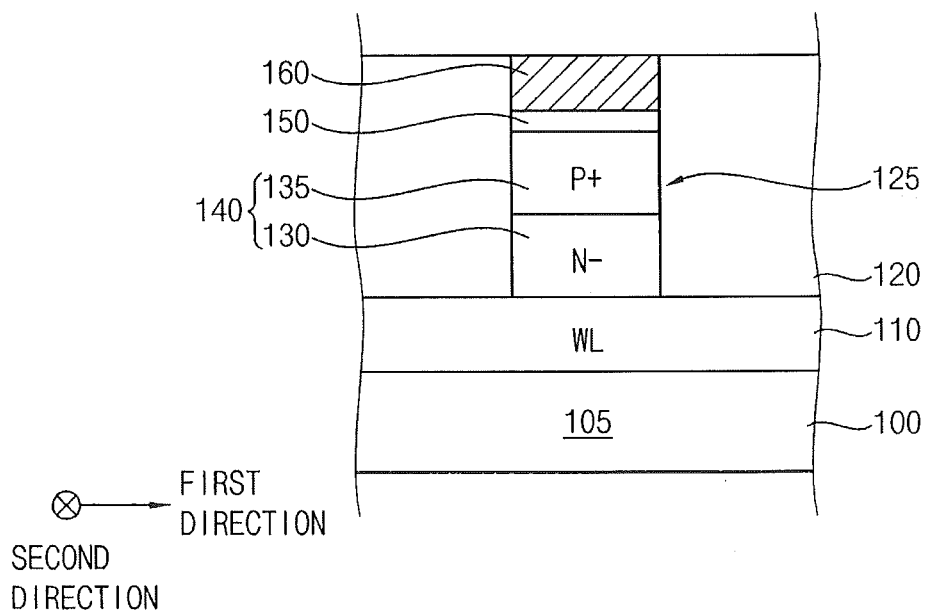

Referring to FIG. 3, a first mold layer 120 may be formed on a substrate 100 having a plurality of word lines 110, and a first opening 125 may be formed through the first mold layer 120 to expose the word lines 110. In example embodiments, a plurality of first openings 125 islanded from one another may be arrayed in a first direction and a second direction substantially perpendicular to the first direction.

The substrate 100 may be divided into an active region 105 and a field region (not shown). The substrate 100 may include a silicon substrate, a silicon-on-insulator (SOI) substrate, a gallium arsenide substrate and/or a silicon germanium substrate.

The word lines 110 may be formed by implanting impurities in the active region 105 of the substrate 100. In an example embodiment, when the substrate 100 is a p-type silicon substrate, the word lines 110 may be formed by implanting n-type impurities. Alternatively, a plurality of epitaxial layers parallel to each other may be formed on the substrate 100 and impurity ions may be implanted or doped into the epitaxial layers to form the word lines 110. Alternatively, a metal thin film may be formed as the word lines 110. Each of the word lines 110 may extend in a first direction substantially the same as a direction in which the active region 105 extends.

The first mold layer 120 may be formed using a silicon oxide, e.g., USG, SOG, BPSG, TOSZ, FOX, TEOS, PE-TEOS and/or HDP-CVD. In example embodiments, the first mold layer 120 may be formed on the substrate 100 by a chemical vapor deposition (CVD) process.

A first conductive layer 130 and a second conductive layer 135 may be sequentially formed on the word line 110 in the first opening 125 to form a diode 140 partially filling the first opening 125. The first and second conductive layers 130 and 135 may be formed using polysilicon doped with impurities, and the conductive type of the impurities of the first and second conductive layers 130 and 135 may be different from each other. The impurities doped in the first and second conductive layers 130 and 135 may vary in accordance with a conductive type of the word lines 110.

The first and second conductive layers may be formed by growing a conductive layer using the word lines 110 exposed by the first opening 125 as a seed layer, and implanting impurities into an upper portion and a lower portion of the conductive layer. The conductive layer may be formed by a selective epitaxial growth (SEG) process and/or by a solid-phase epitaxial (SPE) growth process.

An ohmic contact layer 150 may be formed on the diode 140, and a contact plug 160 may be formed on the ohmic contact layer 150 to fill a remaining portion of the first opening 125. The ohmic contact layer 150 may be formed using a metal silicide, e.g., cobalt silicide and/or tungsten silicide. In example embodiments, metal ions, e.g., cobalt ions and/or tungsten ions may be implanted in an upper portion of the diode 140, a heat treatment process may be preformed at a temperature of about 800° C. to about 900° C. to form the ohmic contact layer 150, A tungsten (W) thin film may be formed on the ohmic contact layer 150 to fill the first opening 125, and a planarization process, e.g., a chemical mechanical planarization (CMP) process or an etch back process may be performed to form a contact plug 160. The ohmic contact layer 150 may reduce a contact resistance between the diode 140 and the contact plug 160.

Figure 4:
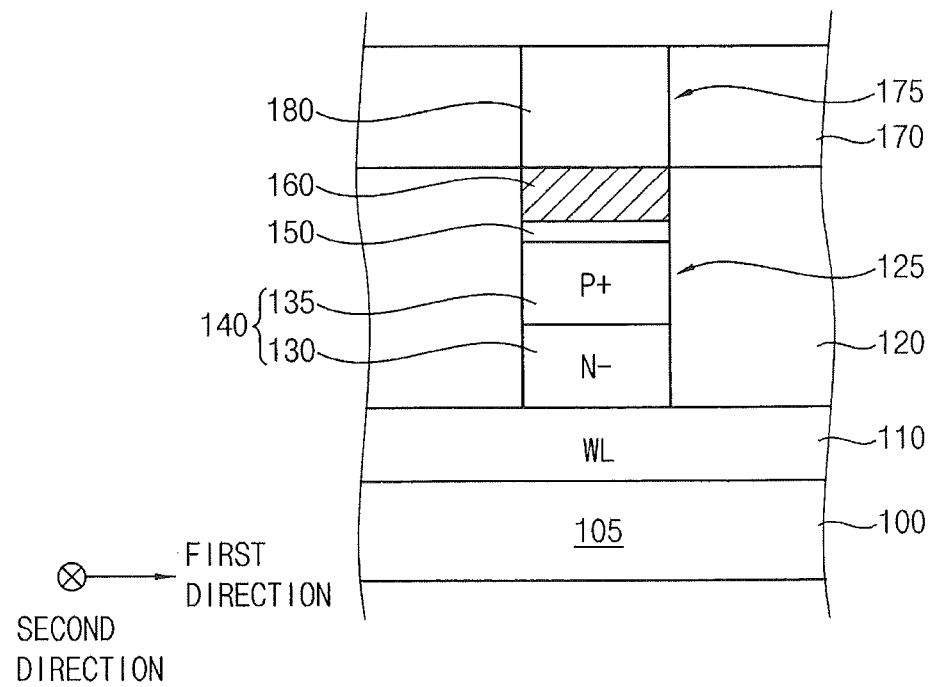

Referring to FIG. 4, a second mold layer 170 may be formed on the contact plug 160 and the first mold layer 120, and the second mold layer 170 may be partially removed to form a second opening 175 partially exposing the contact plug 160. A heating electrode 180 may be formed on the contact plug 160 to fill the second opening 175. The heating electrode 180 may heat a phase-change material pattern 200 (see FIG. 6) subsequently formed.

The second mold layer 170 may be formed using a silicon oxide, e.g., USG, SOG, BPSG, TOSZ, FOX, TEOS, PE-TEOS, HDP-CVD. In some embodiments, the second mold layer 170 may be formed using a material substantially the same as that of the first mold layer 120. The second mold layer 170 may be formed using silicon nitride and/or silicon oxynitride. In example embodiments, the second mold layer 170 may be formed by a CVD process. In example embodiments, a plurality of second openings 175 islanded from one anther may be formed according to the first openings 125.

The heating electrode 180 may be formed using a metal or a metal compound, e.g., titanium carbide (TiC), tantalum carbide (TaC), titanium nitride (TiN), tantalum nitride (TaN), tungsten nitride (WN), titanium carbon nitride (TiCN), titanium silicon nitride (TiSiN) and/or tantalum silicon nitride (TaSiN) that may not be reacted with the phase-change material pattern 200 (see FIG. 6) subsequently formed. The heating electrode 180 may be formed by forming a heating electrode layer on the contact plug 160 to fill the second opening 175, and performing a planarization process, e.g., a CMP process or an etch back process on the heating electrode layer. The heating electrode layer may be formed by a chemical vapor deposition (CVD) process, a plasma enhanced chemical vapor deposition (PECVD) process, an atomic layer deposition (ALD) process, a pulsed laser deposition (PLD) process and/or a sputtering process. In example embodiments, a plurality of heating electrode 180 may be formed according to the plurality of the second openings 175.

Figure 5:
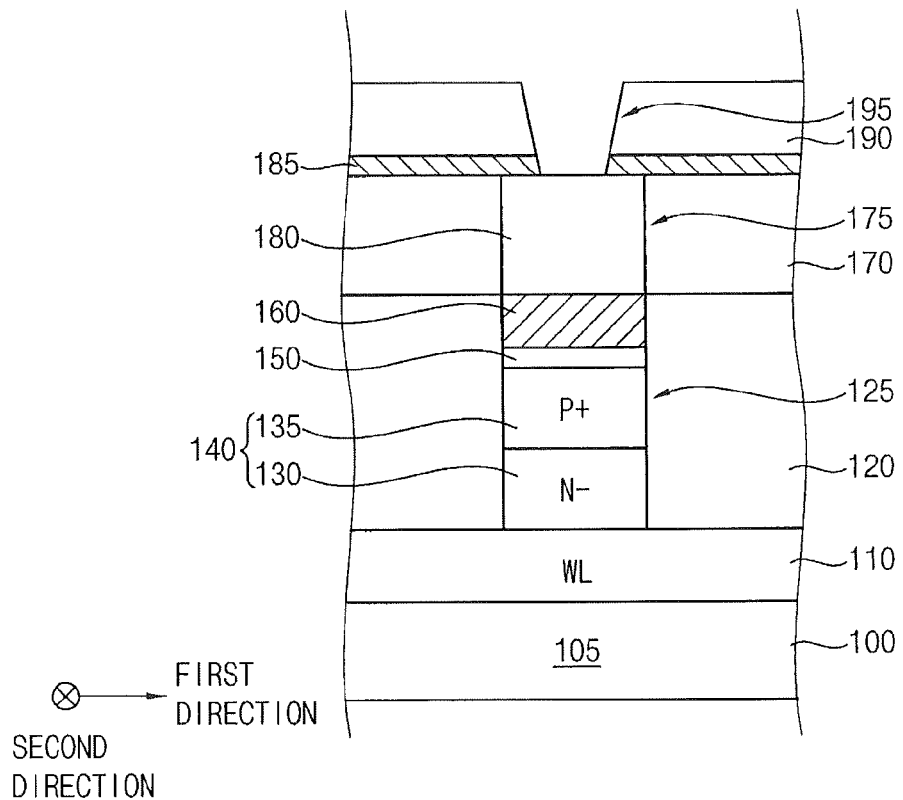

Referring to FIG. 5, a third mold layer 190 may be formed on the second mold layer 170 and the heating electrode 180, and the third mold layer 190 may be partially removed to form a third opening 195 partially exposing the heating electrode 180 and a portion of the second mold layer 170 adjacent to the heating electrode 180.

The third mold layer 190 may be formed using a silicon oxide, e.g., USG, SOG, BPSG, TOSZ, FOX, TEOS, PE-TEOS and/or HDP-CVD. In an example embodiment, the third mold layer 190 may be formed from a material substantially the same as that of the second mold layer 170. In example embodiments, the third mold layer 190 may be formed on the second mold layer 170 and the heating electrode 180 by a CVD process.

The third opening 195 may have a linear shape extending in the second direction. In example embodiments, a plurality of the third openings 195 may be formed along the first direction, spaced apart from one another at a predetermined distance. Top surfaces of the plurality of heating electrodes 180 arranged along the second direction may be exposed by one of the third openings 195. The third opening 195 may be formed to have a sidewall substantially perpendicular or inclined to a top surface of the second mold layer 170.

In example embodiments, an etch selectivity between the third mold layer 190 and the second mold layer 170 may be small, so that a first etch stop layer pattern 185 having a desired etch selectivity with respect to the third mold layer 190 may be further formed between the third mold layer 190 and the second mold layer 170. Particularly, a first etch stop layer may be formed using silicon nitride or silicon oxynitride, and the first etch stop layer may be partially etched to form the first etch stop layer pattern 185 partially exposing top surfaces of the heating electrodes 180.

Figure 6:
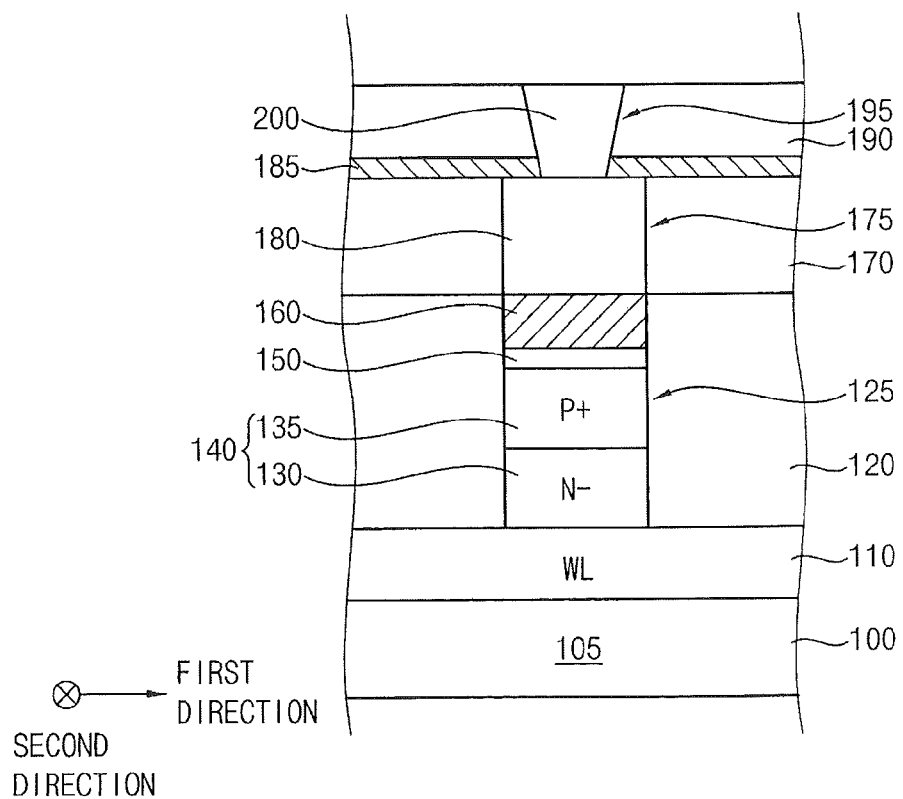

Referring to FIG. 6, a phase-change material layer may be formed on the exposed top surfaces of the heating electrodes 180 and the third mold layer 190 to fill the third opening 175, and an upper portion of the phase-change material layer may be planarized until a top surface of the third mold layer 190 is exposed to form a phase-change material pattern 200 in the third opening 195.

The phase-change material pattern 200 may be disposed on the heating electrode 180 and the third mold layer 190, and may extend in the second direction. The phase-change material pattern 200 may have a linear pillar shape according to the shape of the third opening 195. In example embodiments, a plurality of phase-change material patterns 200 may be formed along the first direction. The phase-change material pattern 200 may be formed using a chalcogenide compound, e.g., GeTe, SbTe, GeSbTe, GeTeAs, SnTeSn, SeTeSn, GeTeSe, SbSeBi, GeBiTe, GeTeTi, InSe, GaTeSe and/or InSbTe.

Figure 7:
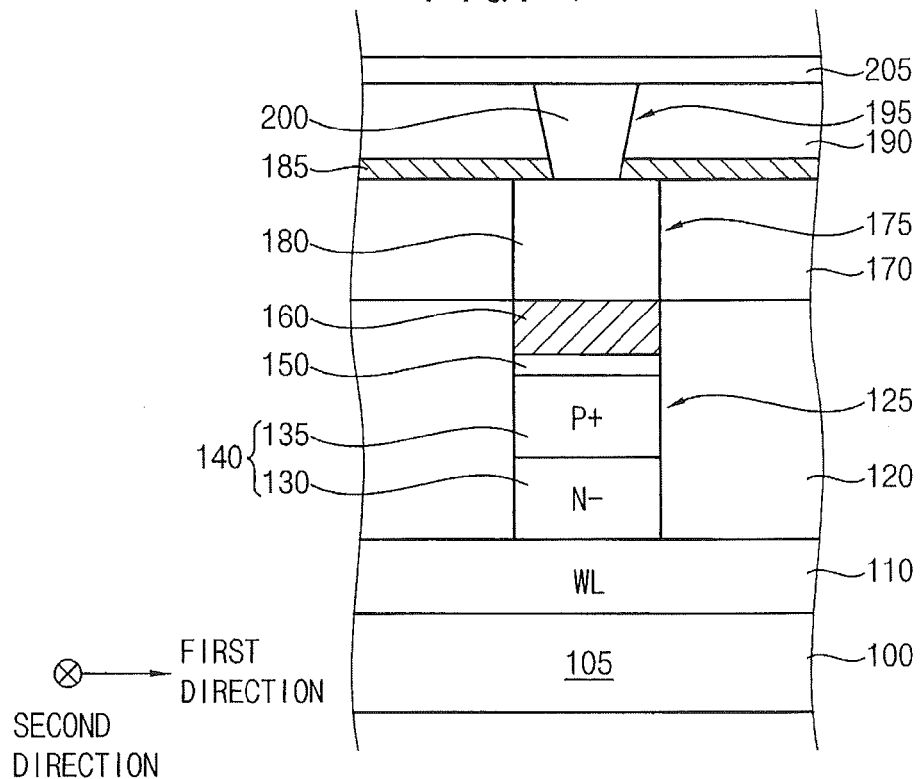

Referring to FIG. 7, a second etch stop layer 205 may be formed on the phase-change material pattern 200 and the third mold layer 190.

The second etch stop layer 205 may be formed using a metal oxide, e.g., magnesium oxide, aluminum oxide, titanium oxide, tantalum oxide, nickel oxide, cobalt oxide, tungsten oxide and/or hafnium oxide having an etch selectivity with respect to the third mold layer 190. In example embodiments, the second etch stop layer 205 may be formed using titanium oxide. The second etch stop layer may be referred to as a material layer.

By controlling the formation of the second etch stop layer 205, e.g., a thickness of a transition metal oxide of the second etch stop layer 205 and/or a degree of oxidation thereof, the second etch stop layer 205 may be configured to substantially block current flow therethrough. For example, the second etch stop layer 205 may be formed to have a thickness of about 50 Å to about 150 Å.

Figure 9:
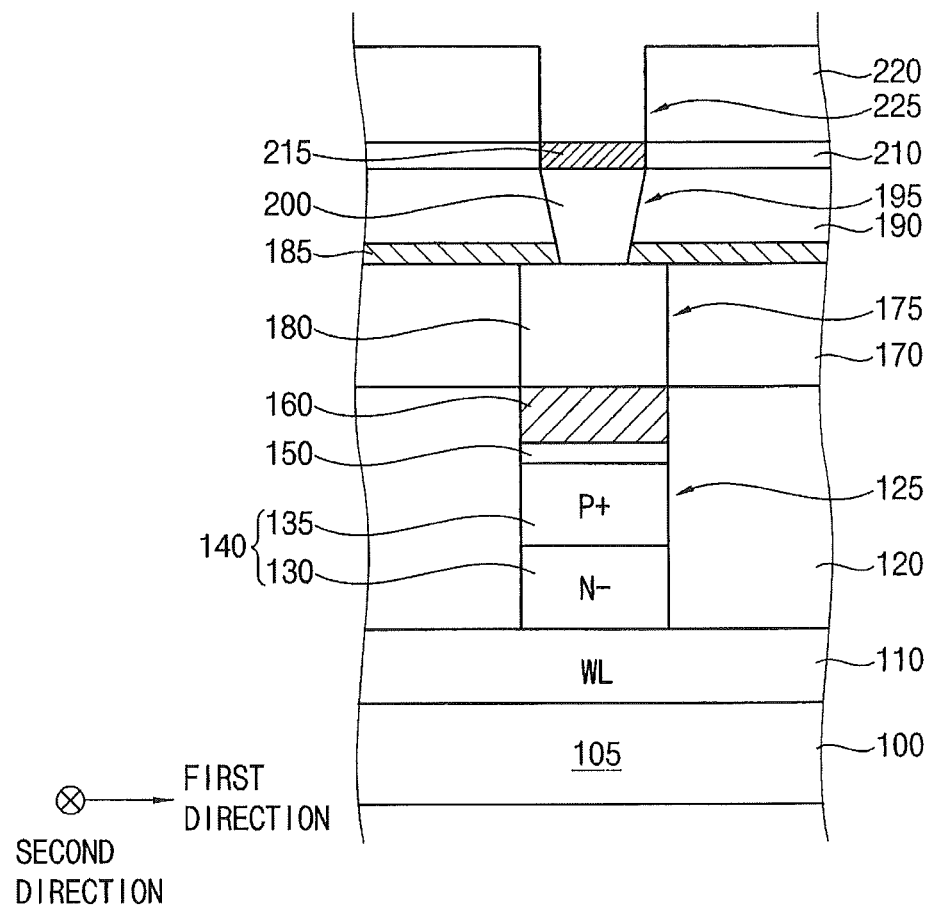
Figure 10:
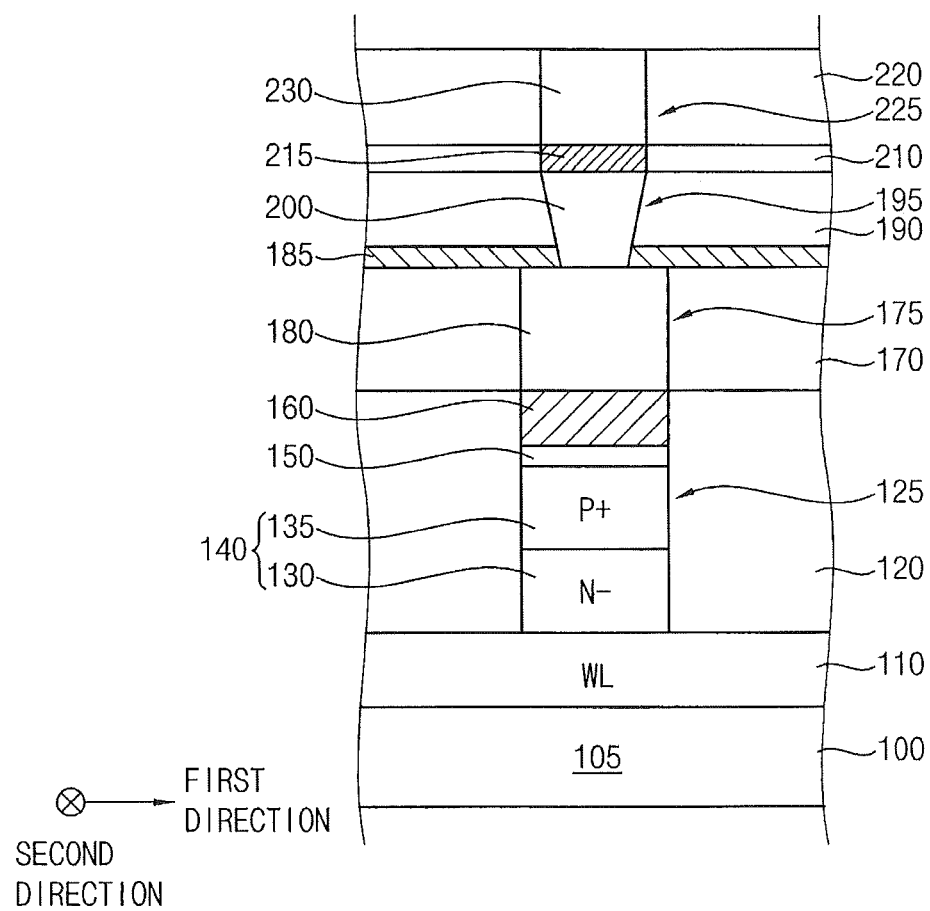

The metal oxide of the second etch stop layer 205 may have a desired etch selectivity with respect to the silicon oxide of the third mold layer 190, so that a top surface of the phase-change material pattern 200 may not be exposed during an etching process for forming a bit line 230 (see FIG. 10). Further, a portion of the second etch stop layer 205 exposed when a fourth mold layer 220 (see FIG. 8) is formed may be transformed to a conductive pattern 215 (see FIG. 9), so that the conductive pattern 215 may electrically connect the phase-change material pattern 200 to the bit line 230.

Figure 8:
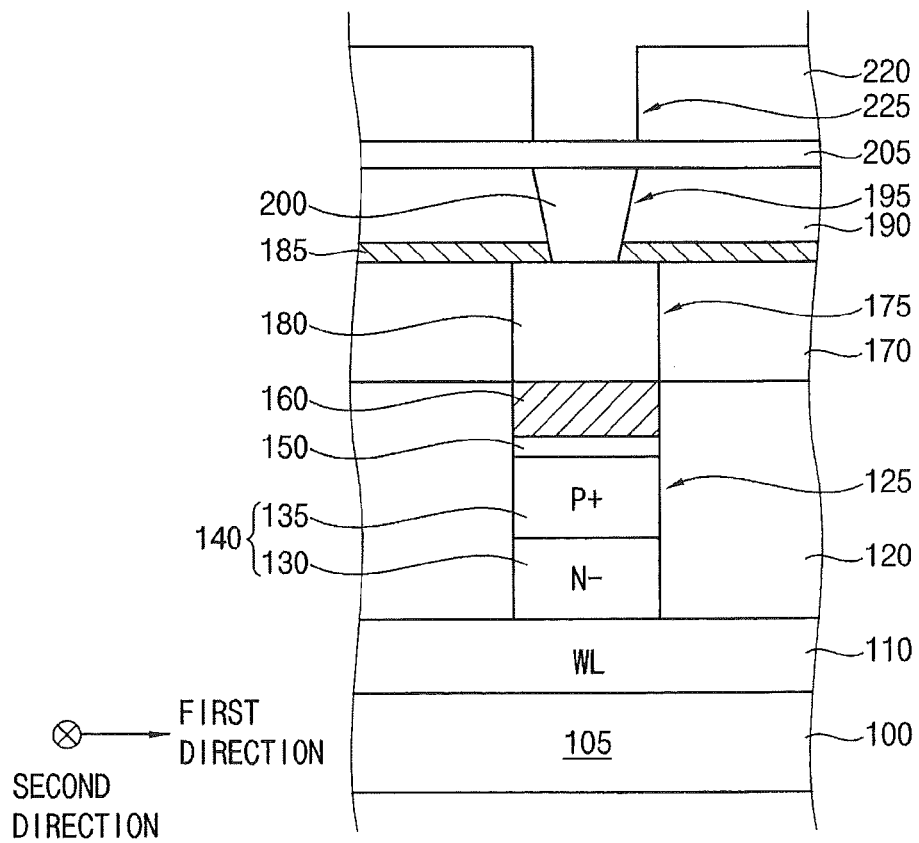

Referring to FIG. 8, a fourth mold layer 220 may be formed on the second etch stop layer 205, and the fourth mold layer 220 may be partially removed to form a fourth opening 225 partially exposing the second etch stop layer 205. The fourth opening 225 may be filled with a conductive material to form the bit line 230, so that a contact region between the bit line 230 and the conductive pattern 215 may be defined. For example, the conductive pattern 215 may be formed to have a thickness of about 50 Å to about 150 Å.

The fourth mold layer 220 may include silicon oxide substantially the same as that of the third mold layer 190. The fourth mold layer 220 may be formed using silicon nitride and/or silicon oxynitride. In example embodiments, the fourth mold layer 220 may be formed by a CVD process, and the fourth opening 225 may be formed to expose a portion of the second etch stop layer 205 overlapping a top surface of the phase-change material pattern 200. The portion of the second etch stop layer 205 exposed by the fourth opening 225 may have a linear shape extending in the second direction.

During an etching process for forming the fourth opening 225, the etching process may be terminated on the second etch stop layer 205, so that the phase-change material pattern 200 may not be exposed. Therefore, whether or not a misalignment between a bottom surface of the second etch stop layer 205 and a top surface of the phase-change material pattern 200 may occur, a top surface of the phase-change material pattern 200 may not be exposed and a phase-change material of the phase-change material pattern 200 may not be vaporized.

Referring to FIG. 9, after performing ashing and cleaning processes on the substrate 100 having the fourth mold layer 220 thereon, a reduction treatment and a nitridation treatment or a carbonization treatment may be performed on the exposed portion of the second etch stop layer 205 through the fourth opening 225 so that the exposed portion of the second etch stop layer 205 may be transformed into the conductive pattern 215. A portion of the second etch stop layer 205, where the conductive pattern 215 may not be formed, remains as a second etch stop layer pattern 210.

A bottom surface of the conductive pattern 215 may contact substantially the entire top surface of the phase-change material pattern 200. The conductive pattern 215 may be formed to extend in the second direction, and may be arranged in parallel to one another in the first direction. The conductive pattern 215 may serve as a current path between the phase-change material pattern 200 and the bit line 230. The conductive pattern 215 may be formed using a metal nitride or a metal carbide. In an example embodiment, the conductive layer 215 may be formed using a metal nitride, e.g., magnesium nitride, aluminum nitride, titanium nitride, tantalum nitride, nickel nitride, cobalt nitride, tungsten nitride and/or hafnium nitride by reducing and nitriding the second etch stop layer pattern 210. Alternatively, the conductive pattern 215 may be formed using a metal carbide, e.g., magnesium carbide, aluminum carbide, titanium carbide, tantalum carbide, nickel carbide, cobalt carbide, tungsten carbide and/or hafnium carbide by reducing and carbiding the second etch stop layer pattern 210. In example embodiments, when the second etch stop layer 210 is formed using titanium oxide, the second etch stop layer pattern 210 may be formed using titanium oxide, and the conductive pattern 215 may be formed using titanium nitride.

The conductive pattern 215 may be formed by treating a portion of the second etch stop layer 205 to have conductivity. Therefore, the conductive pattern 215 may include a metal substantially the same as the metal of the second etch stop layer 205.

The cleaning process may include a wet cleaning process or a dry cleaning process for removing a residue generated in the ashing process.

In an example embodiment, the plasma treatment process may include a plasma hydrogenation treatment process and a plasma nitridation treatment process. The plasma treatment process may be performed at a temperature of below about 400° C.

By the plasma hydrogenation treatment process, a metal oxide in the exposed portion of the second etch stop layer 205 by the fourth opening 225 may be reduced into a metal, and the reduced metal may be transformed to the conductive pattern 215 including a metal nitride having a conductivity by the plasma nitridation treatment process. Concentrations of the metal and the nitrogen in the conductive pattern 215 may be controlled according to a degree of the nitridation treatment in the plasma nitridation treatment process, so that an electrical conductivity between the phase-change material pattern 200 and the bit line 230 subsequently formed may be controlled. Therefore, in order to sufficiently form an electrical contact between the phase-change material pattern 200 and the bit line 230, the conductive pattern 215 may be formed to have a thickness substantially the same as or larger than that of the second etch stop layer pattern 210.

In example embodiments, the plasma hydrogenation treatment process may be performed using hydrogen ($H_2$) gas as a process gas, and the plasma nitridation treatment process may be performed using nitrogen ($N_2$) gas, ammonia ($NH_3$) gas or hydrazine ($N_2H_4$) gas.

Alternatively, the plasma treatment process may include the carbonization treatment process instead of the plasma nitridation treatment process. By the carbonization treatment process, the exposed portion of the second etch stop layer 205, which may be reduced into a metal, may be formed as the conductive pattern 215 including a metal carbide having conductivity.

In example embodiments, the carbonization treatment process may be performed by supplying a carbon precursor and performing a high temperature heat treatment. A coal, a graphite, a carbon fiber, carbon nanotubes or a carbon black may serve as the carbon precursor. The high temperature heat treatment may be performed in an inert gas atmosphere at a temperature of about 900° C. to about 1500° C.

Referring to FIG. 10, the bit line 230 may be formed on the conductive pattern 215 to fill the fourth opening 225.

In example embodiments, a barrier layer may be formed on the conductive pattern 215, an inner wall of the fourth opening 225 and the fourth mold layer 220, and a conductive layer may be formed on the barrier layer. The conductive layer and the barrier layer may be partially removed by a CMP process or an etch back process until a top surface of the fourth mold layer 220 may be exposed, thereby forming the bit line 230.

The barrier layer may be formed using titanium, tantalum, titanium nitride, tantalum nitride and/or titanium silicide, and the conductive layer may be formed using copper and/or tungsten.

In an example embodiment, when the conductive layer is formed using copper, a seed layer of copper may be formed on the barrier layer, and the conductive layer may be formed by growing copper from the seed layer to fill the fourth opening 225 by an electroplating process. /when the conductive layer is formed using tungsten, tungsten may be deposited on the barrier layer to fill the fourth opening 225, and the tungsten may be planarized.

As described above, in the phase-change memory device, the second etch stop layer 205 may be formed between the phase-change material pattern 200 and the bit line 230, and a plasma treatment may be performed on the portion of the second etch stop layer 205 contacting the phase-change material pattern 200 and the bit line 230, thereby forming a conductive pattern 215. Therefore, a conventional misalignment between an upper electrode and a phase-change material pattern during a formation of the upper electrode may be reduced. Additionally, when the fourth opening 225 for forming the bit line 230 is formed, the second etch stop layer pattern 210 including a transition metal oxide may be formed, so that the top surface of the phase-change material pattern 200 may not be exposed and the phase-change material may not be vaporized, even though the misalignment may occur.

Second Embodiments

Figure 11:
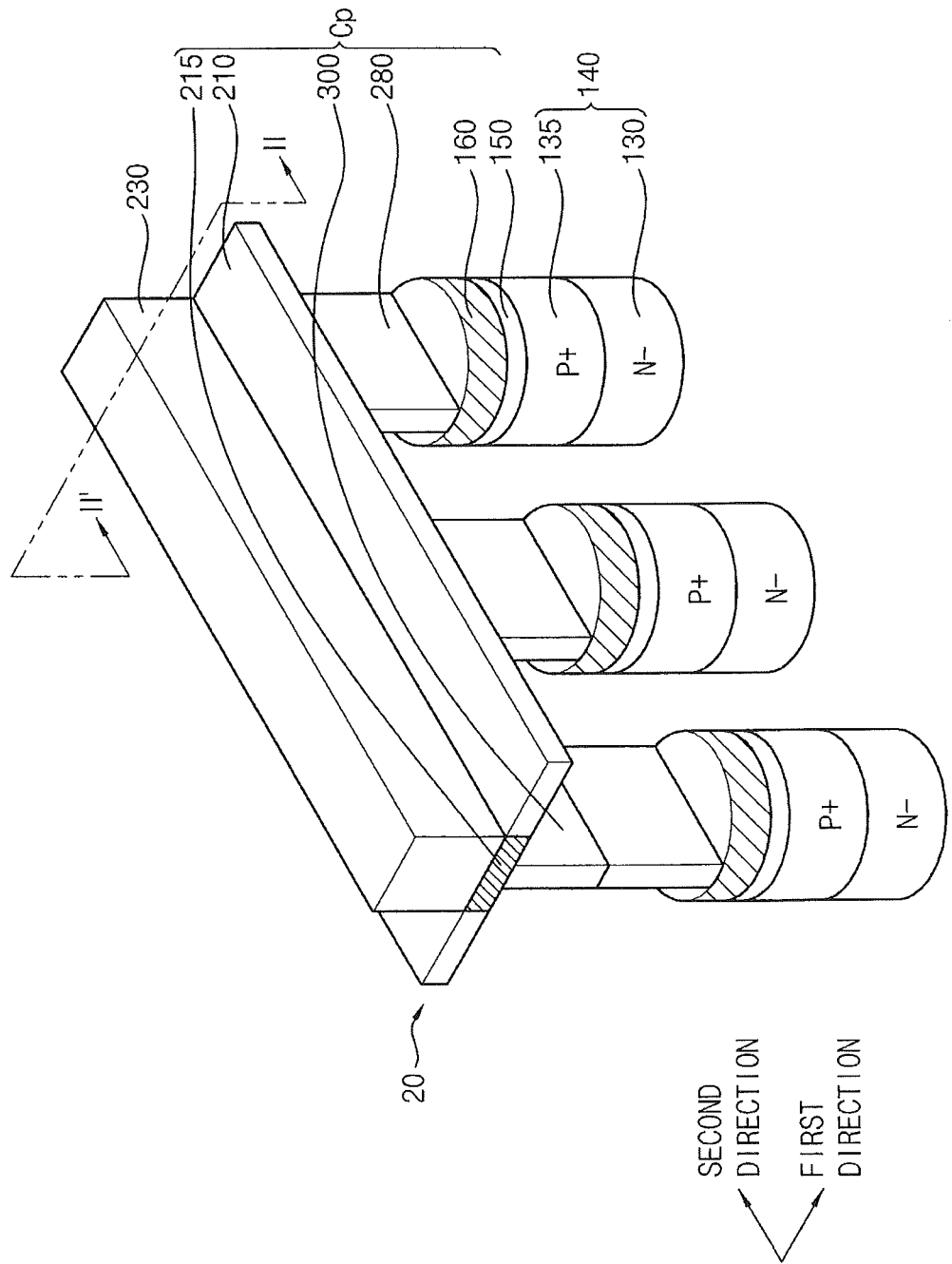
Figure 12:
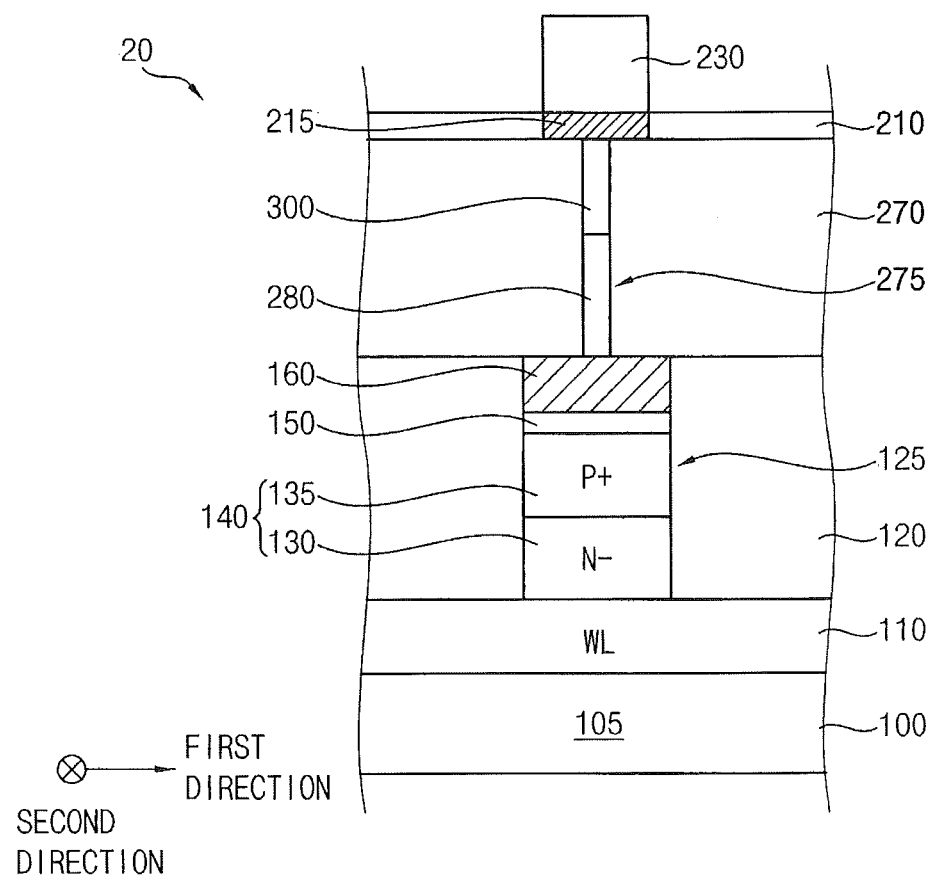

FIG. 11 is a perspective view illustrating a phase-change memory device in accordance with second embodiments, and FIG. 12 is a cross-sectional view illustrating the phase-change memory device taken along a line II-II' of FIG. 11. The phase-change memory device in FIGS. 11 and 12 may include elements substantially the same as those in FIGS. 1 and 2. Thus, like reference numerals refer to like elements, and repetitive explanations thereon are omitted here.

Referring to FIGS. 11 and 12, the phase-change memory device 20 in accordance with the second embodiments may include a substrate 100, a first mold layer 120, a unit cell Cp on the substrate 100, a non-uniform conductivity layer pattern on the unit cell Cp and a bit line 230 on the non-uniform conductivity layer pattern substantially the same as those in the first embodiments. The unit cell Cp may have a diode 140 including a first conductive layer 130 and a second conductive layer 135, an ohmic contact layer 150, a contact plug 160. The non-uniform conductivity layer pattern may include a second etch stop layer pattern 210 and a conductive pattern 215 substantially the same as those in the first embodiments. The conductive pattern 215 may be a conductive region, and the second etch stop layer pattern 210 may be a non-conductive region. The substrate 100 may be divided into an active region 105 having a plurality of word lines 110 at upper portions thereof and a field region having no word lines 110.

The phase-change memory device 20 in accordance with the second embodiments may include a second mold layer 270, a heating electrode 280 and a phase-change material pattern 300 having shapes different from those in the first embodiments.

The phase-change memory device 20 may include the second mold layer 270, the heating electrode 280 and the phase-change material pattern 300. The second mold layer 270 may have a second opening 275 partially exposing the contact plug 160. The second opening 275 having a shape of a rectangular pillar may have a width smaller than that of the contact plug 160. Therefore, the heating electrode 280 and the phase-change material pattern 300 may be stacked vertically and may have a shape of a rectangular pillar.

The heating electrode 280 and the phase-change material pattern 300 in accordance with the second embodiments may include materials substantially the same as those in the first embodiments, so that repetitive explanations thereon are omitted here.

In the phase-change memory device 20, the second mold layer 270 may include the second opening 275 for containing the heating electrode 280 and the phase-change material pattern 300. The phase-change material pattern 300 having a shape of rectangular pillar may have a width substantially the same as the heating electrode 280. A bottom surface of the conductive pattern 215 may have an area larger than a top surface of the phase-change material pattern 300, thereby sufficiently covering the top surface of the phase-change material pattern 300. Accordingly, a misalignment between the bit line 230 and the phase-change material pattern 300 may be prevented. Whether or not the misalignment may occur, the unit cell Cp including the phase-change material pattern 300 may be protected.

Figure 13:
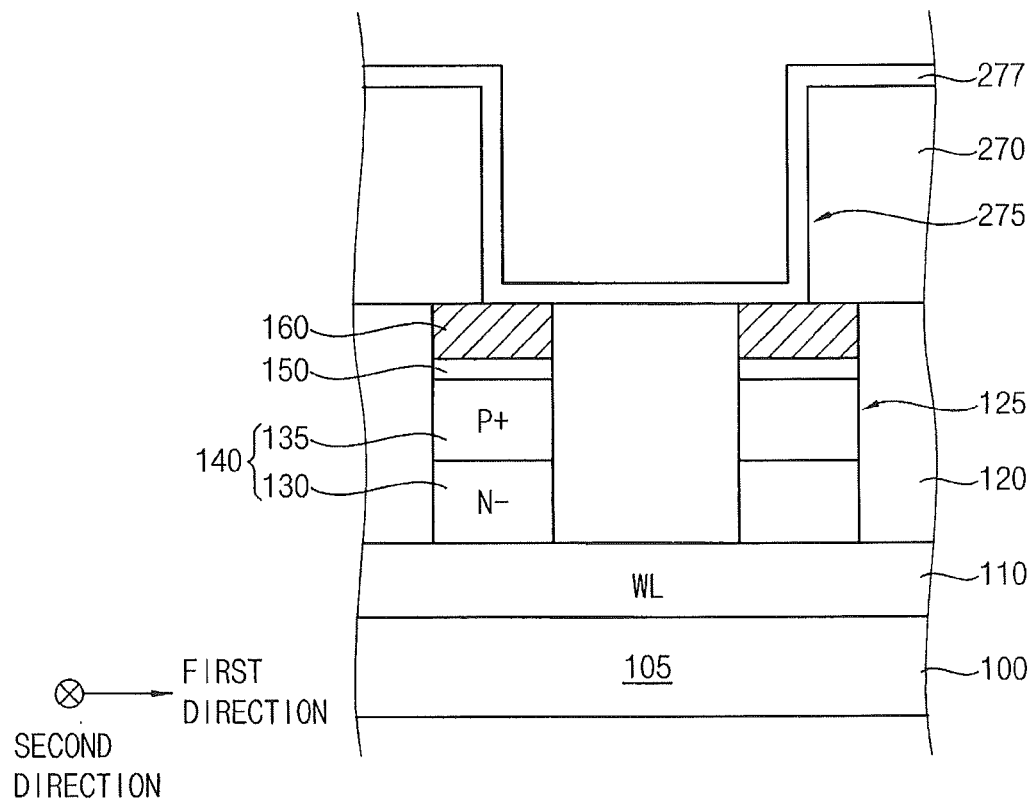

FIGS. 13 to 16 are cross-sectional views illustrating a method of manufacturing the phase-change memory device of FIGS. 11 and 12. In FIG. 13, processes for forming a word line 110 on a substrate 100, forming a first mold layer 120 having a first opening 125 on the word line 110, and forming a diode 140 including a first conductive layer 130 and a second conductive layer 135, an ohmic contact layer 150 and a contact plug 160 in the first opening 125 may be performed substantially the same as the processes in FIG. 3.

Referring to FIG. 13, a second mold layer 270 having a second opening 275 may be formed on the first mold layer 120 and the contact plug 160. The second mold layer 270 may be formed using a silicon oxide substantially the same as that of the first mold layer 120. The second opening 275 may be formed to expose a plurality of contact plugs 160. A heating electrode layer 277 may be conformally formed on the second mold layer 270 and an inner wall of the second opening 275.

Figure 14:
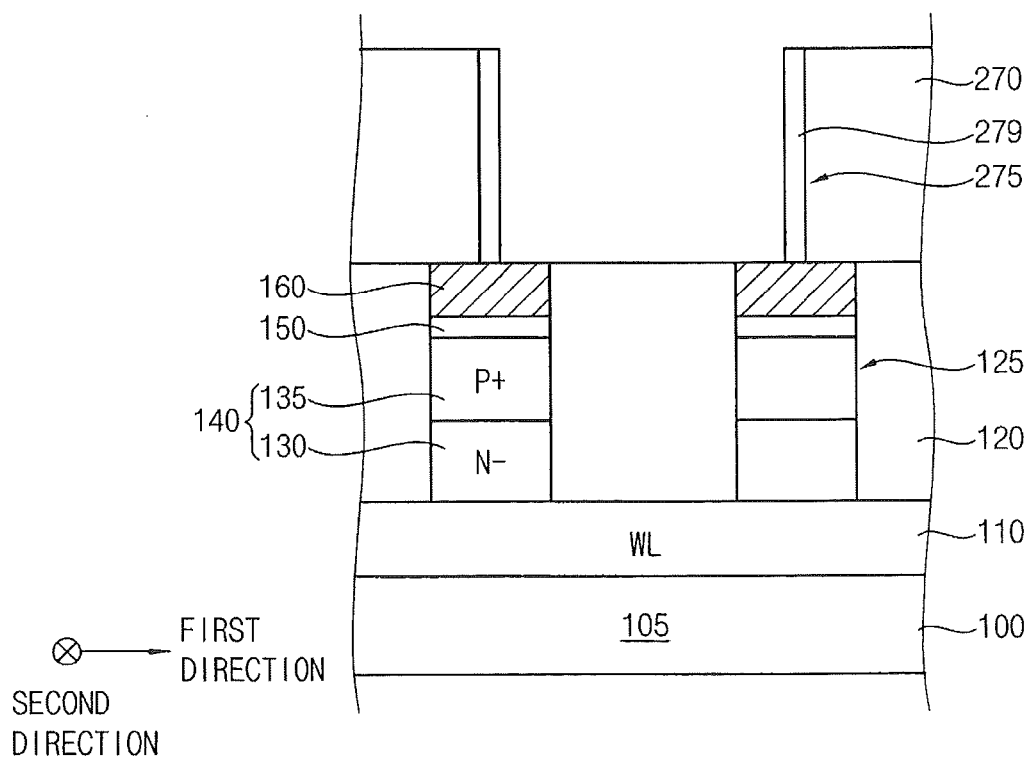

Referring to FIG. 14, the heating electrode layer 277 on a top surface of the second mold layer 270 and a bottom surface of the second opening 275 may be partially removed, so that preliminary heating electrodes 279 may remain only on both sidewalls of the second opening 275. Therefore, the preliminary heating electrodes 279 of a first unit cell and a second unit cell may be formed simultaneously. The preliminary heating electrodes 279 may have widths smaller than that of the contact plug 160, and may have a shape of "I" or "L".

Figure 15:
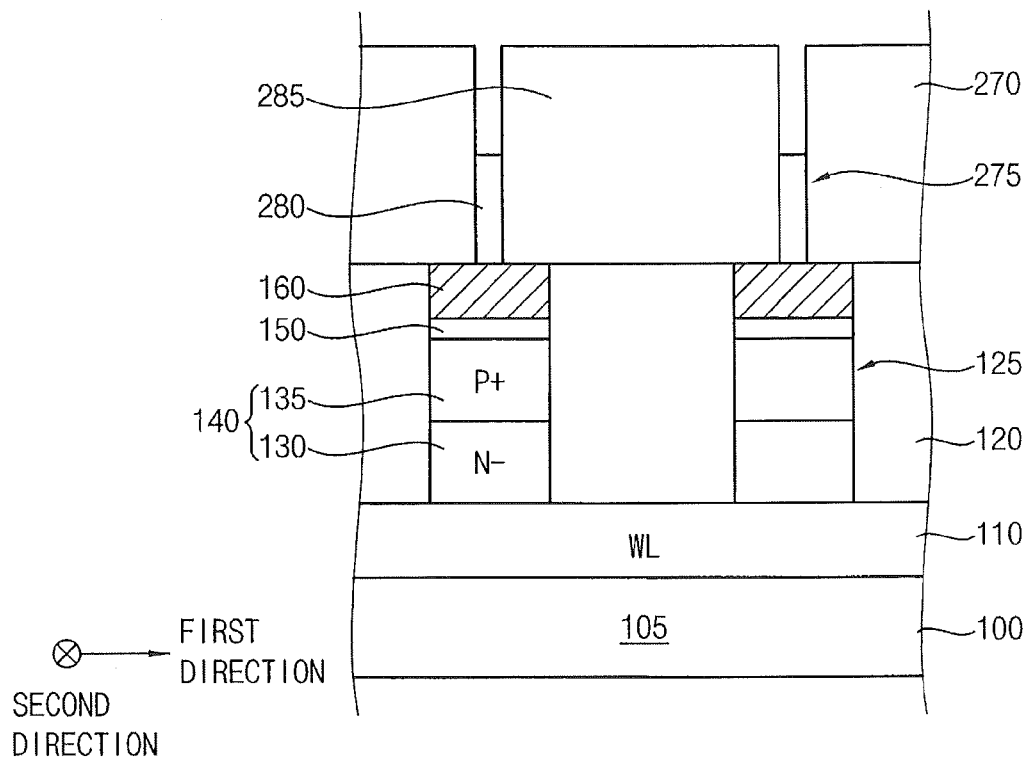

Referring to FIG. 15, an insulation material 285 may be formed to fill the second opening 275. The insulation material 285 may be formed using a material substantially the same as that of the second mold layer 270. The preliminary heating electrode 279 may be patterned to have an isolated shape. The insulation material 285 may fill the second opening 275. An upper portion of the patterned preliminary heating electrode 279 may be removed to form a heating electrode 280.

Figure 16:
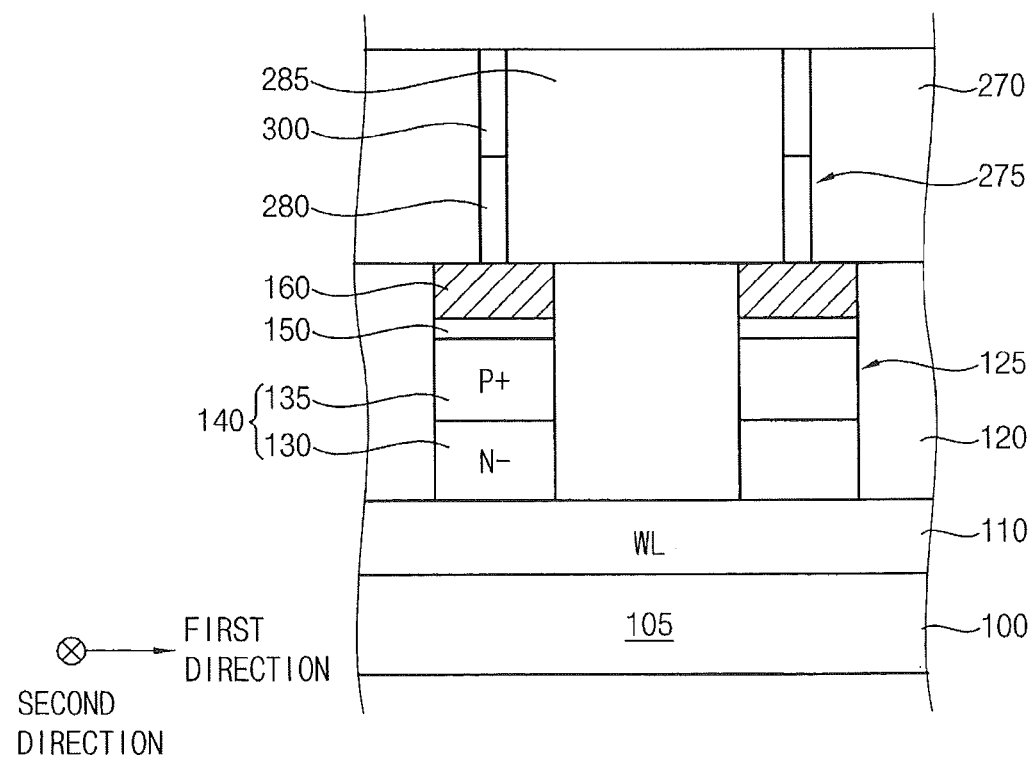

Referring to FIG. 16, after forming a phase-change material layer filling a remaining portion of the second opening 275, the phase-change material layer may be planarized until the top surface of the second mold layer 270 is exposed, so that a phase-change material pattern 300 may be formed on the heating electrode 280.

By performing processes substantially the same as those of FIGS. 7 to 10, a second etch stop layer pattern 210 and a conductive pattern 215 may be formed on the second mold layer 270 and the phase-change material pattern 300, and a bit line 230 may be formed on the conductive pattern 215 to complete the phase-change memory device 20 (See FIG. 12).

In the phase-change memory device 20 in accordance with the second embodiments, the heating electrode 280 and the phase-change material pattern 300 may be formed simultaneously, so that an additional mold layer for forming the phase-change material pattern 300 may not be required. The phase-change material patterns 300 and the heating electrodes 280 of the first unit cell and the second unit cell may be formed simultaneously by a single process.

Third Embodiments

Figure 17:
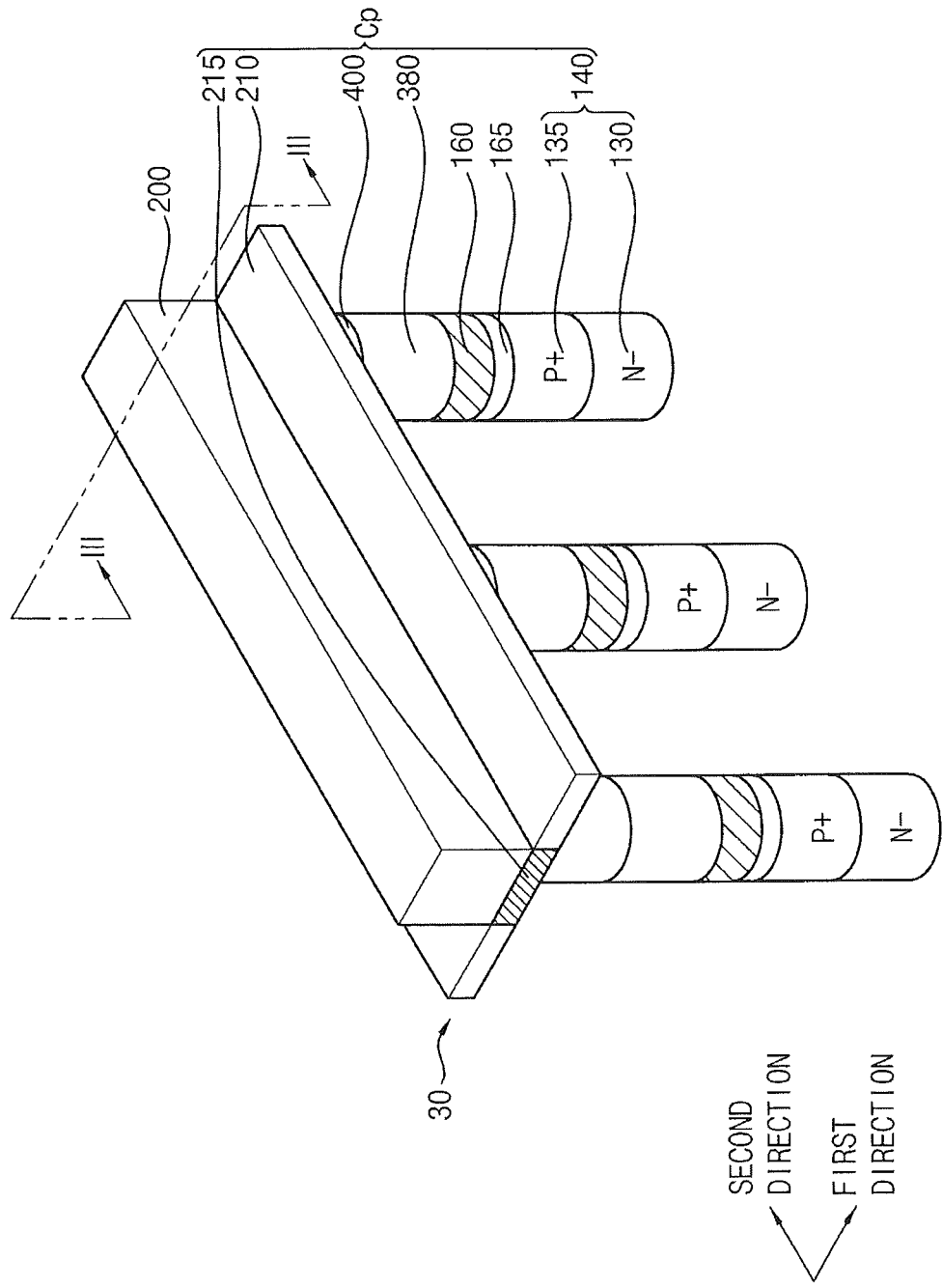
Figure 18:
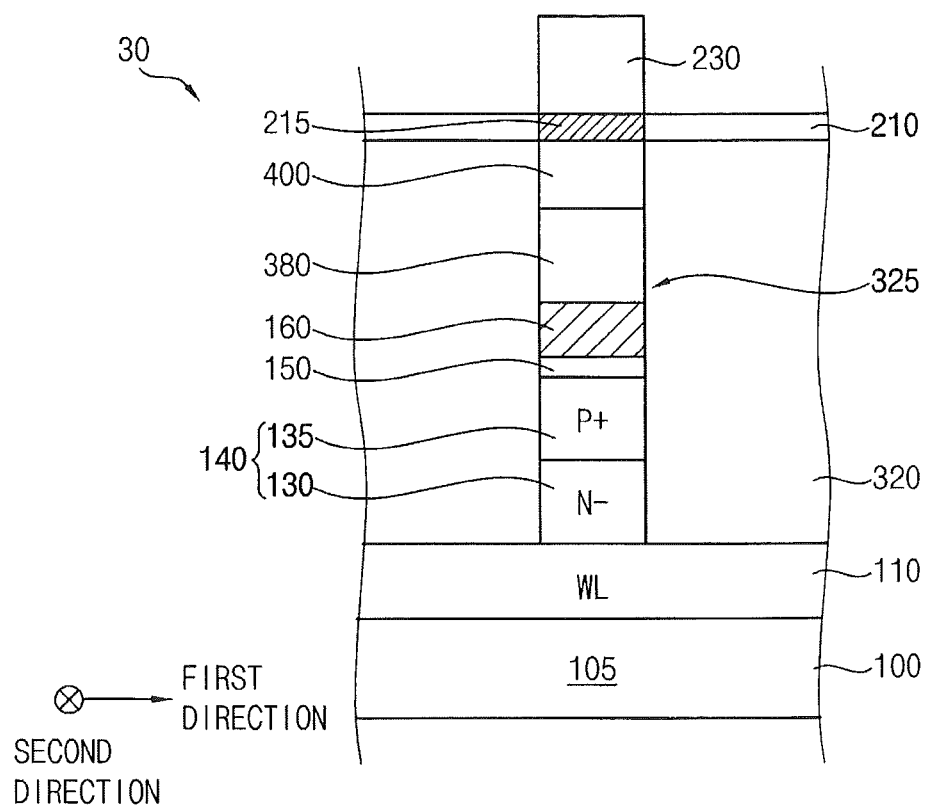

FIG. 17 is a perspective view illustrating a phase-change memory device in accordance with third embodiments, and FIG. 18 is a cross-sectional view illustrating the phase-change memory device taken along a line III-III' of FIG. 17. The phase-change memory device in FIGS. 17 and 18 may include elements substantially the same as those in FIGS. 1 and 2. Thus, like reference numerals refer to like elements.

Referring to FIGS. 17 and 18, the phase-change memory device 30 in accordance with the third embodiments may include a substrate 100, a unit cell Cp on the substrate 100, a non-uniform conductivity layer pattern on the unit cell Cp and a bit line 230 substantially the same as those in the first embodiments. The unit cell Cp may include a diode 140 including a first conductive layer 130 and a second conductive layer 135, an ohmic contact layer 150, a contact plug 160. The non-uniform conductivity layer pattern may include a second etch stop layer pattern 210 and a conductive pattern 215 substantially the same as those in the first embodiments. The conductive pattern 215 may be a conductive region, and the second etch stop layer pattern 210 may be a non-conductive region.

The phase-change memory device 30 in accordance with The third embodiments may include a first mold layer 320, a heating electrode 380 and a phase-change material pattern 400 having shapes different from those in the first embodiments.

The first mold layer 320 may have a first opening 325 for containing the diode 140, the ohmic contact layer 150, the contact plug 160, the heating electrode 380 and the phase-change material pattern 400. The first opening 325 having a shape of a circle or an ellipse may partially expose a word line 110 on the substrate 100. The first opening 325 may have a relatively large depth to be filled with not only the diode 140, the ohmic contact layer 150 and the contact plug 160 but also the heating electrode 380 and the phase-change material pattern 400. Therefore, the heating electrode 380 and the phase-change material pattern 400 may be stacked vertically, and may have a shape of a circle or an ellipse.

The heating electrode 380 and the phase-change material pattern 400 in accordance with the third embodiments may include materials substantially the same as those in the first embodiments, respectively, so that repetitive explanations thereon are omitted here.

In the phase-change memory device 30, a thickness of the first mold layer 320 may be relatively large to compensate thicknesses of the heating electrode 380 and the phase-change material pattern 400. The phase-change material pattern 400 also may fill the first opening 325, so that the phase-change material pattern 400 may have a shape of a circle or an ellipse. A bottom surface of the conductive pattern 215 may have an area larger than a top surface of the phase-change material pattern 300 to reduce or prevent a misalignment between the bit line 230 and the phase-change material pattern 400. Whether or not the misalignment may occur, the unit cell Cp including the phase-change material pattern 400 may be protected.

Figure 19:
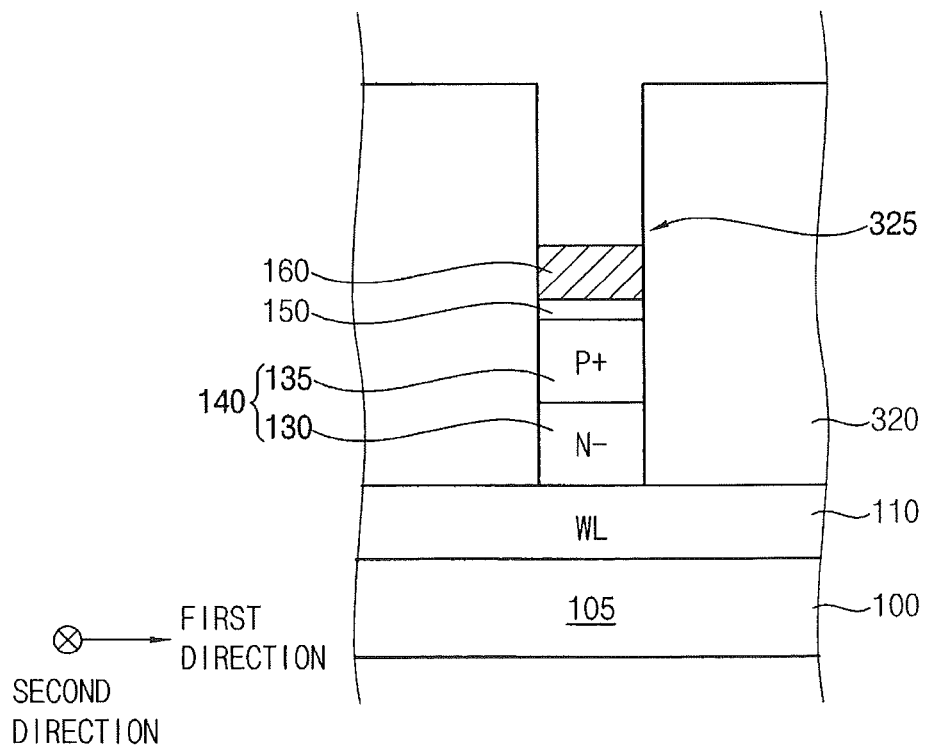
Figure 20:
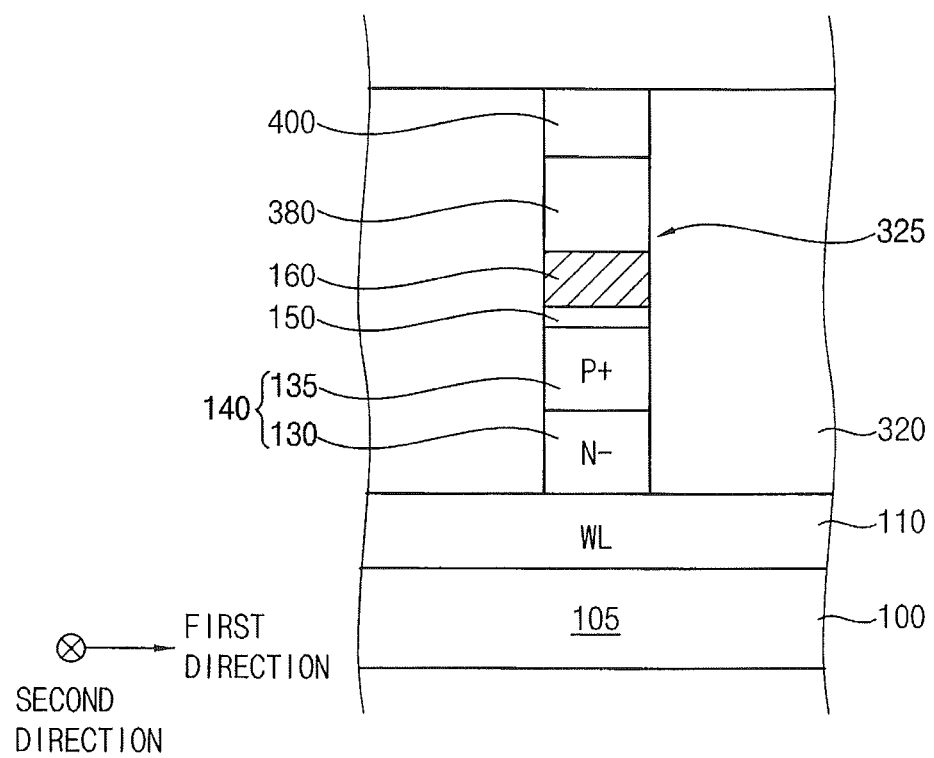

FIGS. 19 to 20 are cross-sectional views illustrating a method of manufacturing the phase-change memory device of FIGS. 17 and 18.

Referring to FIG. 19, a first mold layer 320 may be formed to have a first opening 325 partially exposing a word line 110 on a substrate 100. The first mold layer 320 may have a relatively large thickness considering heights of a heating electrode 380 and a phase-change material pattern 400 in addition to heights of a diode 140, an ohmic contact layer 150 and a contact plug 160 (See FIG. 20). The first opening 325 may be formed through the first mold layer 320 to have a shape of a circle or an ellipse. The diode 140 including a first conductive layer 130 and a second conductive layer 135, the ohmic contact layer 150 and the contact plug 160 may be formed sequentially in the first opening 325.

Referring to FIG. 20, the heating electrode 380 and the phase-change material pattern 400 may be sequentially formed on the contact plug 160 to fill a remaining portion of the first opening 325. Therefore, the heating electrode 380 and the phase-change material pattern 400 may also have a shape of circle or an ellipse according to the shape of the first opening 325.

Then, by performing processes substantially the same as those of FIGS. 7 to 10, a second etch stop layer pattern 210 and a conductive pattern 215 may be formed on the first mold layer 320 and the phase-change material pattern 400, respectively, and a bit line 230 may be formed on the conductive layer pattern 215 to complete the phase-change memory device 30 (See FIG. 18).

In the phase-change memory device 30 in accordance with the third embodiments, the first mold layer 320 may be formed, while an additional mold layer for forming the heating electrode 380 and the phase-change material pattern 400 may not be required. A top surface of the phase-change material pattern 400 may be formed to have a shape of a circle or an ellipse. A bottom surface of the conductive pattern 215 may be larger than a top surface of the phase-change material pattern 400, so that the phase-change material pattern 400 may not be exposed, even though a misalignment may occur during etching process of the bit line 230.

In a phase-change memory device, a bit line and a phase-change material pattern may contact each other without an upper electrode. A bit line contact may be formed by a reduction treatment process and a nitridation treatment process of a transition metal oxide. Therefore, the misalignment between the upper electrode and the phase-change material pattern may be reduced or prevented.

Additionally, the transition metal oxide may serve as an etch stop layer during an etching process of a bit line, so that the phase-change material may not be exposed not to be vaporized, even though a misalignment between the bit line and underlying phase-change material pattern may occur.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method comprising:
    forming a first mold layer on a substrate and having a first opening exposing a word line;
    forming a contact plug on the word line in the first opening;
    forming a second mold layer on the first mold layer and having a second opening exposing the contact plug;
    forming a heating electrode on the contact plug in the second opening;

forming a third mold layer on the second mold layer and having a third opening exposing the heating electrode;

forming a phase-change material pattern on the heating electrode in the third opening;

forming a material layer on the phase-change material pattern and the third mold layer;

forming a fourth mold layer on the material layer and having a fourth opening exposing a portion of the material layer on the phase-change material pattern;

plasma hydrogenating to reduce the exposed portion of the material layer to a metal;

plasma carbonizing the metal to form a metal carbide region; and forming a bit line on the metal carbide region.

2. The method of claim 1, wherein plasma carbonizing comprises using coal, graphite, carbon fiber, carbon nanotubes and/or carbon black.

3. The method of claim 1, wherein the material layer comprises magnesium oxide, aluminum oxide, titanium oxide, tantalum oxide, nickel oxide, cobalt oxide, tungsten oxide and/or hafnium oxide.

4. The method of claim 1, wherein forming a contact plug on the word line in the first opening is preceded by sequentially forming a diode and an ohmic contact layer on the word line in the first opening and wherein forming a contact plug on the word line in the first opening comprises forming the contact plug on the ohmic contact layer.

5. A method comprising:

forming a phase-change memory cell on a substrate, the phase-change memory cell comprising a phase-change material pattern;

forming a material layer on the phase-change material pattern;

forming a mold layer on the material layer and having an opening exposing a portion of the material layer on the phase-change material pattern;

plasma hydrogenating to reduce the exposed portion of the material layer to a metal;

plasma carbonizing the metal to produce a metal carbide region; and forming a bit line on the metal carbide region.

* * * * *